(12) United States Patent
Yu et al.

(10) Patent No.: US 6,180,468 B1
(45) Date of Patent: Jan. 30, 2001

(54) VERY LOW THERMAL BUDGET CHANNEL IMPLANT PROCESS FOR SEMICONDUCTORS

(75) Inventors: Bin Yu, Santa Clara; Emi Ishida, Sunnyvale; Scott Luning, San Francisco; Timothy Thurgate, Sunnyvale, all of CA (US)

(73) Assignee: Advanced Micro Devices Inc., Sunnyvale, CA (US)

( * ) Notice: Under 35 U.S.C. 154(b), the term of this patent shall be extended for 0 days.

(21) Appl. No.: 09/177,774

(22) Filed: Oct. 23, 1998

(51) Int. Cl.[7] ............... H01L 21/336; H01L 21/3203
(52) U.S. Cl. ............... 438/297; 438/303; 438/305; 438/592
(58) Field of Search ............... 438/291, 303, 438/305, 300, 299, 297, 592

(56) References Cited

U.S. PATENT DOCUMENTS

| | | | |
|---|---|---|---|
| 5,168,072 | * 12/1992 | Moslehi | 437/41 |
| 5,545,579 | * 8/1996 | Laing et al. | 437/44 |
| 5,576,227 | * 11/1996 | Hsu | 437/35 |
| 5,767,557 | * 6/1998 | Kizilyali | 257/403 |
| 5,856,225 | * 1/1999 | Lee et al. | 438/291 |
| 5,858,843 | * 1/1999 | Doyle et al. | 438/299 |
| 5,904,530 | * 5/1999 | Shin | 438/291 |
| 5,917,219 | * 6/1999 | Nandakumar | 257/348 |
| 5,952,693 | * 9/1999 | Wu et al. | 257/344 |

* cited by examiner

Primary Examiner—Richard Elms
Assistant Examiner—Michael S. Lebentritt
(74) Attorney, Agent, or Firm—Mikio Ishimaru

(57) ABSTRACT

An ultra-low thermal budget process is provided for channel implant by using a reverse process sequence where a conventional MOS transistor is formed without the channel implant. The originally deposited polysilicon gate is removed, a nitride film deposition and etch is used to form a nitride spacer with a predetermined configuration, and a self-aligned channel implant is performed. After the channel implantation, anneal and super-retrograded doping, the nitride spacer and the gate oxide are removed for subsequent regrowth of a second gate oxide and a polysilicon deposition to form a second polysilicon gate.

18 Claims, 2 Drawing Sheets

VERY LOW THERMAL BUDGET CHANNEL IMPLANT PROCESS FOR SEMICONDUCTORS

TECHNICAL FIELD

The present invention relates generally to the implantation of channels in semiconductors and more particularly to the reduction of the process thermal budget for channel implantation.

BACKGROUND ART

In the manufacture of semiconductors, a silicon substrate is subject to a large number of processes before the final semiconductor devices are completed. In making transistors, there are a number of steps starting from implanting various dopants into the semiconductor substrate, depositing insulating gate oxides, forming gates, and implanting various doping elements to form the source/drain junctions (and source/drain extension junctions for more recent sub-0.25 micron transistors). Each of the implantation steps often require a thermal anneal, or heating step, to activate, or cause to become electrically active, of the implanted material. Generally, the thermal anneal requires a certain amount of time, and the temperature times the time for a particular step is called the step thermal budget. The total thermal budget for all the steps in the manufacturing process is called the process thermal budget.

As semiconductors are reduced in size, a major problem occurs in that the source/drain junctions and their extensions become so close that the electrons punch-through effect occurs so leakage current flows between them. It is to prevent this problem that dopants are added to the channel. The difficulty is that the dopant is usually added at the beginning of the process and then is subject to additional cycles of thermal anneal as additional implantation and diffusion steps are implemented as explained above. The thermal budget is essentially the temperature multiplied by time that a region is subjected to. A long duration, high temperature step requires a high thermal budget. The lighter doping near the channel surface of the silicon is desirable to increase carrier mobility and reduce scattering while the higher doping in the channel subsurface is desirable to eliminate the punch-through effect. The ideal situation is to have all the processing done at as low a temperature as possible for as short a period as possible to prevent massive diffusion. But enough thermal budget is required to activate the dopant.

The reduction of process thermal budget is very critical in fabricating sub-100 nm MOS transistors. In order to suppress the so-called "short-channel effect" which degrades transistor performance and manufacturability, ultra-low thermal budget processes for channel dopant implant are required. Further, a large thermal budget also causes the doping in the channel to diffuse towards the source/drain junction, which increases the parasitic capacitance. This, in turn, degrades the MOS field-effect transistor speed.

In an ideal process, the dopant concentration near the silicon surface should be very low because it is beneficial to the carrier mobility. At the same time, the dopant concentration in the subsurface of the silicon should be very high before dropping off, because it provides good immunity to short-channel effect (such as threshold voltage roll-off, drain-induced-barrier lowering, and source/drain punch-through, etc.)

The difference in the dopant concentration is usually 1 to 2 orders of magnitude. However, achieving a sharp transition in the doping profile is extremely difficult in a CMOS process. One of the major reasons is that in a conventional CMOS process, the channel implant must be performed before the source/drain implant anneal and the source/drain extension implant anneal. Therefore, the total thermal budget for the channel implant is large because it includes the thermal budgets for the source/drain implant and the source/drain extension implant. Thus, any initial, sharp doping profile is diffused by the additional thermal input.

Thus, as transistors have shrunk in size, there has been an intense search for the ideal process by which the dopant concentration near the silicon surface can be very low while the concentration in the subsurface is very high. This has been very difficult, if not impossible, to achieve previously.

DISCLOSURE OF THE INVENTION

The present invention provides an ultra-low thermal budget process for channel implant by using a reverse process sequence where a conventional MOS transistor is formed without the channel implant. The originally deposited polysilicon gate material is removed, a nitride film deposition and etch is used to form a configured nitride spacer defining an implant opening, and a self-aligned channel implant is performed. After the super-retrograded channel implantation, the nitride spacer and the original gate oxide are removed for subsequent regrowth of a second gate oxide and a polysilicon deposition to reform the polysilicon gate. The anneal of the channel implant is performed after the anneals for source/drain junctions and source/drain extension junctions.

The present invention provides a very low thermal budget for the retrograded channel doping implant because the channel implant is performed after the source/drain implant, the source/drain extension implants, and the corresponding thermal annealing processes.

The present invention further provides a channel implant with a very sharp doping profile.

The present invention still further provides a channel implant which is self-aligned to the polysilicon gate.

The present invention still further provides a controlled, spatially-confined implant which can be spaced away from the source/drain junction to avoid increasing the parasitic junction capacitance.

The present invention still further provides for a regrown gate oxide and redeposited gate without the plasma etching steps in a conventional gate stack formation. This helps avoid the plasma-induced thin gate oxide damage which causes device reliability problems.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
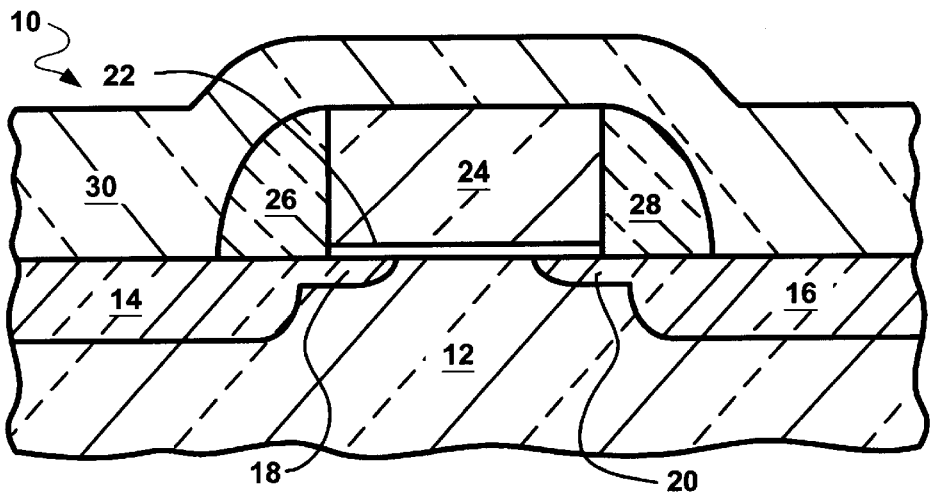
FIG. 1 is a cross-sectional view of a conventional MOS transistor without the channel implant.

Referring now to FIG. 1, therein is shown a cross-section of a conventional MOS device, such as transistor 10, having a silicon substrate 12. The silicon substrate 12 has implanted source/drain junctions 14 and 16 and source/drain extension junctions 18 and 20.

Disposed over the source/drain extension junctions 18 and 20 on the silicon substrate 12 is an insulating layer, or gate oxide 22, with a polysilicon gate 24 deposited thereon. Also shown are the oxynitride junction spacers 26 and 28 which have a previous use during the junction implantations. A protective oxide layer 30 is disposed over the silicon substrate 12, the oxynitride junction spacers 26 and 28, and the polysilicon gate 24.

Figure 2:
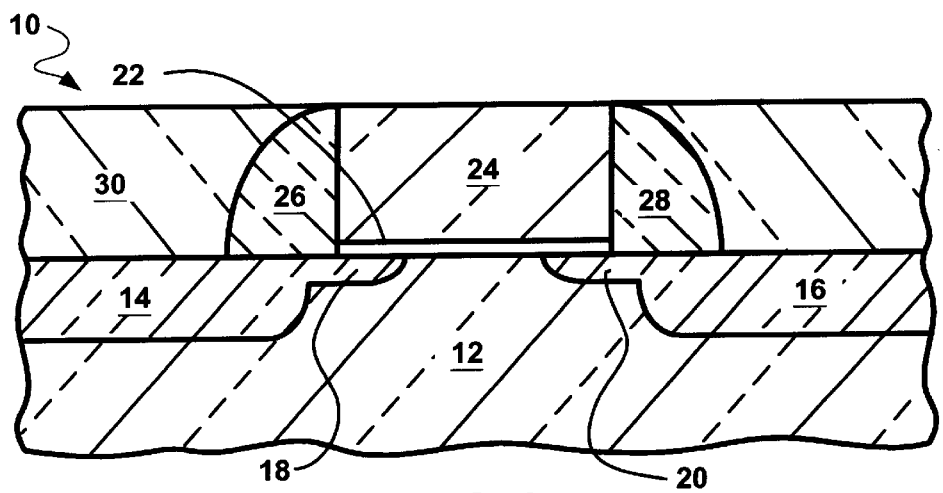
FIG. 2 is FIG. 1 after chemical-mechanical polishing to expose the polysilicon gate.

Referring now to FIG. 2, therein is shown FIG. 1 after chemical-mechanical polishing of the oxide layer 30 to expose the top of the polysilicon gate 24. The same numbers are used in FIG. 2 to represent the same parts as in FIG. 1.

Figure 3:
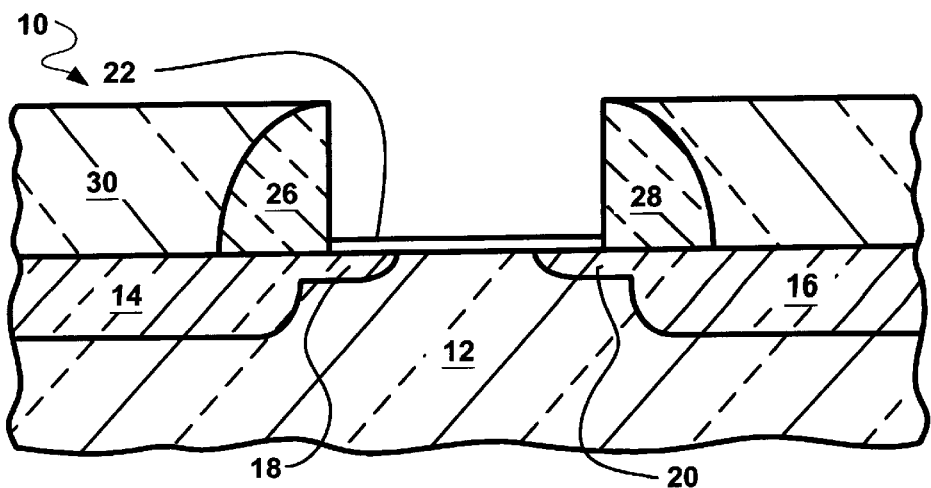
FIG. 3 shows FIG. 2 after removal of the polysilicon gate down to the gate oxide.

Referring now to FIG. 3, therein is shown FIG. 2 with the polysilicon gate 24 having been etched away down to the gate oxide 22. The same numbers are used in FIG. 3 to represent the same parts as in FIG. 2.

Figure 4:
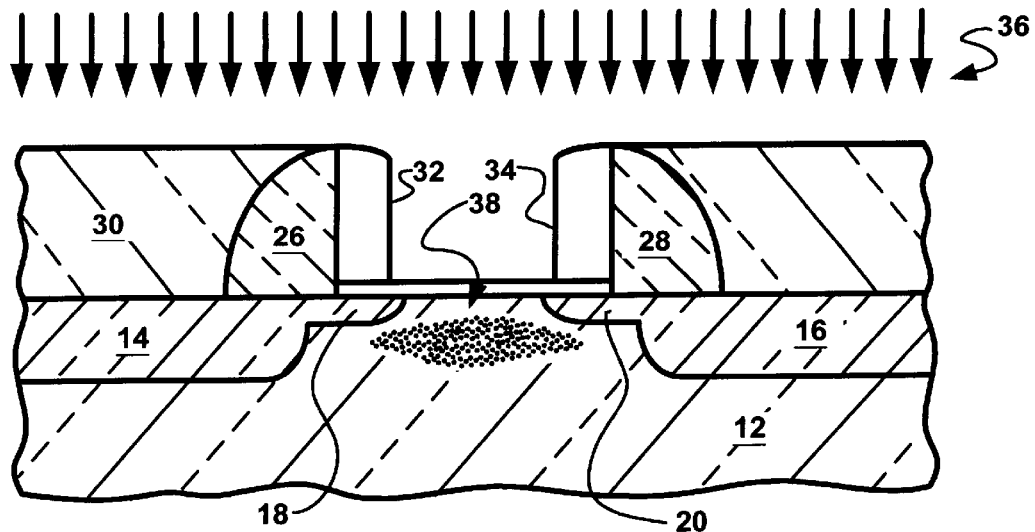
FIG. 4 shows FIG. 3 after deposition and etch of a nitride deposition and etch to form nitride spacers, and including the self-aligned channel implant.

Referring now to FIG. 4, therein is shown FIG. 3 after several steps. First, the void where the polysilicon gate 24 was etched away is first filled with a nitride deposition. The nitride deposition is then etched down to the gate oxide 22 to form nitride gate spacers 32 and 34. After the nitride gate spacers 32 and 34 are formed to the configuration shown in FIG. 4, there is a dopant implantation 36 through the gate oxide 22 into the silicon substrate 12 to form the doped area 38. The configuration of the nitride gate spacers 32 and 34 control the implantation to be self-aligned with the polysilicon gate location. The same numbers are used in FIG. 4 to represent the same parts as in FIG. 3.

Figure 5:
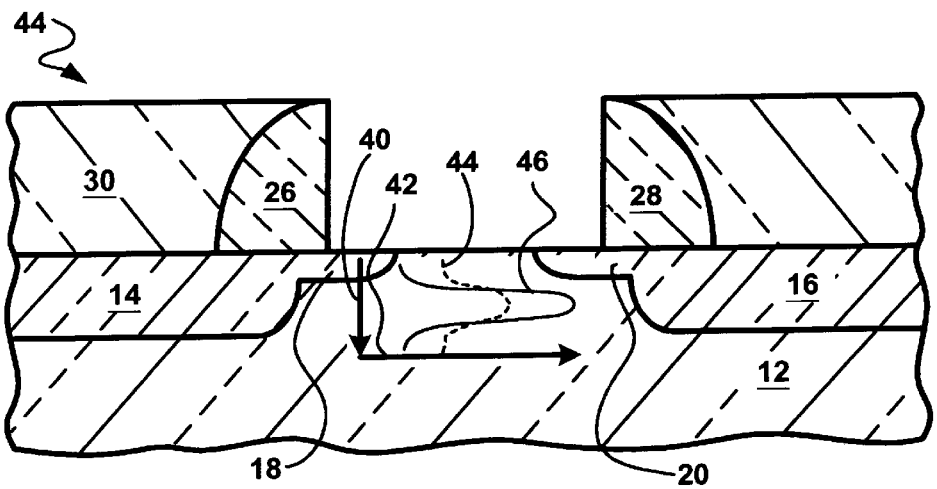
FIG. 5 shows FIG. 4 with the removal of the nitride spacer and gate oxide down to the silicon surface.

Referring now to FIG. 5, therein is shown FIG. 4 with the nitride gate spacers 32 and 34, and the gate oxide 22 removed. After the anneal, the channel dopant will have the super-retrograded doping profile shown by arrow 40 which indicates the depth from the surface and arrow 42 which indicates the doping concentration. The further the curve from the arrow 40, the greater the concentration of dopant.

The doping profile 44 shows the prior art while doping profile 46 shows the present invention. As can be seen, the doping profile 46 starts with an extremely low concentration near the surface of the semiconductor substrate 12 which increases below the surface before decreasing to the extremely low concentration, similar to that at the surface. This is described as being "super-retrograde". The prior art doping profile 44 is much flatter by contrast with a higher initial doping concentration which peaks at a lower concentration. With the present invention for a 100 nm transistor, the doping concentration at the surface would be about $10^{17}$ atoms/cm$^3$ and at a depth of 30–60 nm it would be about $10^{19}$ atoms/cm$^3$. This contrasts to about $10^{18}$ atoms/cm$^3$ at the surface and about $5\times10^{18}$ atoms/cm$^3$ at a depth of 30–60 nm.

Figure 6:
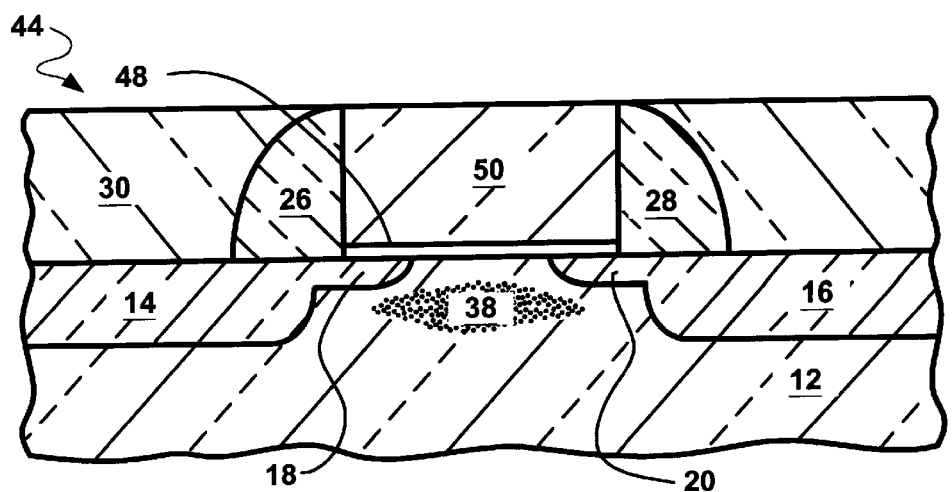
FIG. 6 shows FIG. 5 with the regrowth of the gate oxide and the polysilicon deposition to refill the polysilicon gate and final chemical-mechanical polishing to form the completed MOS semiconductor.

Referring now to FIG. 6, therein is shown FIG. 4 with a second gate oxide 40 having been regrown on the silicon substrate 12. A second polysilicon gate 42 is deposited on top of the second gate oxide 40. Finally, chemical-mechanical polishing is used to level the polysilicon gate 40 with the oxide 30 to form the final MOS transistor 44. Generally, there will be a further protective oxide over the polysilicon gate 40, but this is not shown and would be obvious to those having ordinary skill in the art.

The manufacturing method of the present invention starts with semiconductor wafers which have been processed to form conventional MOS transistors such as the transistor 10. The source/drain junctions 14 and 16 and the source/drain extension junctions 18 and 20 have already been implanted and annealed. Thus, their thermal budgets will not appear as part of subsequent implantations.

The oxide coating 30 is first removed by chemical-mechanical polishing to expose the polysilicon gate 24. The polysilicon gate 24 is exposed so as to allow removal by a wet etch which does not etch the oxide 30 or the gate oxide 22.

After removal of the polysilicon gate 24, a nitride film is deposited over the gate oxide 22 and the oxide 30. A controlled etch is then performed to form the nitride gate spacers 32 and 34 on the gate oxide 22 with the opening shown therebetween in FIG. 4. The width of the original polysilicon gate 24 determines the original opening, and thus, with the opening in the nitride gate spacers 32 and 34 being set by the original opening, the subsequent channel implant is self-aligned.

The channel implant is of dopants such as indium, antimony, phosphorous, arsenic, or other elements. Once the self-aligned channel implant is complete, the nitride gate spacers 32 and 34 and the gate oxide 22 are plasma etched and removed. This exposes the silicon substrate 12.

Thereafter, a new gate oxide 40 is regrown on the silicon substrate 12. This regrowth helps to avoid the plasma-induced thin gate oxide damage that often causes device reliability problems.

After the gate oxide 40 is grown to the desired thickness, a layer of polysilicon is deposited on the gate oxide 40 and the oxide 30. Subsequently, chemical-mechanical polishing is used to form the new gate 42. This completes the processing to form the MOS transistor 44.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor after formation of a device having a gate imbedded in a protective layer and a gate insulator layer deposited on a source/drain junction implanted semiconductor substrate, comprising the steps of:

removing the gate and leaving a space in the protective layer;

implanting a dopant into said semiconductor substrate through the space in the protective layer wherein implanting said dopant provides a super-retrograded doping profile; and depositing a second gate.

2. The method of manufacturing a semiconductor as claimed in claim 1 including the steps of:

removing the gate insulator layer after said implanting step; and depositing a second gate insulator layer.

3. The method of manufacturing a semiconductor as claimed in claim 1 including the steps of:

depositing a spacer material into the space in the protective layer;

forming said spacer material to a predetermined configuration for said implanting step; and removing said spacer material after said implanting step.

4. The method of manufacturing a semiconductor as claimed in claim 1 wherein said semiconductor substrate has source/drain extension junctions and including the step of:

thermal annealing said implanted dopant after thermal annealing of the source/drain extension junctions.

5. The method of manufacturing a semiconductor as claimed in claim 1 including junction spacers disposed adjacent the gate and wherein said step of:

removing the gate leaves the junction spacers in place; and including a step of:

depositing a spacer material to replace the gate within said junction spacers.

6. The method of manufacturing a semiconductor as claimed in claim 1 wherein the semiconductor substrate has source/drain extension junctions and a channel therebetween, wherein said step of:

implanting said dopant implants said dopant for the channel after implantation of the source/drain extension junctions.

7. The method of manufacturing a semiconductor as claimed in claim 1 wherein the protective layer covers the gate and including the step of:

removing the protective layer covering the gate before the step of removing the gate.

8. The method of manufacturing a semiconductor as claimed in claim 1 wherein:

said step of implanting uses a material selected from a group comprising indium, tin, antimony, and a combination thereof.

9. A method of manufacturing a semiconductor after formation of a device having a polysilicon gate imbedded in an oxide layer and a gate oxide deposited on a source/drain junction implanted semiconductor substrate, comprising the steps of:

removing the polysilicon gate and leaving an opening in the oxide layer;

implanting a dopant into said semiconductor substrate through the opening in the oxide layer wherein implanting said dopant provides a super-retrograded doping profile; and depositing a second polysilicon gate.

10. The method of manufacturing a semiconductor as claimed in claim 9 including the steps of:

removing the gate oxide after said implanting step; and depositing a second gate oxide.

11. The method of manufacturing a semiconductor as claimed in claim 9 including the steps of:

depositing a nitride spacer into the opening in the oxide layer;

etching said nitride spacer to a predetermined configuration for said implanting step; and removing said nitride spacer after said implanting step.

12. The method of manufacturing a semiconductor as claimed in claim 9 wherein said semiconductor substrate has source/drain extension junctions and including the step of:

thermal annealing said implanted dopant after thermal annealing of the source/drain extension junctions.

13. The method of manufacturing a semiconductor as claimed in claim 9 including oxynitride junction spacers disposed adjacent the gate and wherein said step of:

removing, the polysilicon gate leaves the oxynitride junction spacers in place; and including a step of:

depositing a nitride spacer to replace the polysilicon gate within said oxynitride junction spacers.

14. The method of manufacturing a semiconductor as claimed in claim 9 wherein the semiconductor substrate has source/drain extension junctions and a channel therebetween, wherein said step of:

implanting said dopant implants said dopant for the channel after implanting of the source/drain extension junctions.

15. The method of manufacturing a semiconductor as claimed in claim 9 wherein the oxide layer covers the polysilicon gate and including the step of:

removing the oxide layer covering the polysilicon gate before the step of removing the polysilicon gate.

16. The method of manufacturing a semiconductor as claimed in claim 9 wherein:

said step of implanting uses a material selected from a group comprising indium, antimony, phosphorous, arsenic, and a combination thereof.

17. The method of manufacturing a semiconductor as claimed in claim 9 wherein said step of implanting a dopant implants less than $10^{17}$ atoms/cm$^3$ of said dopant at the surface of the semiconductor substrate and about $10^2$ atoms/cm$^3$ additional of said dopant below the surface of the semiconductor substrate than at the surface thereof.

18. The method of manufacturing a semiconductor as claimed in claim 9 wherein said step of implanting a dopant implants about $10^{17}$ atoms/cm$^3$ of said dopant at the surface of the semiconductor substrate and less than $10^{19}$ atoms/cm$^3$ of said dopant between 30 to 60 nm below the surface of the semiconductor substrate.

\* \* \* \* \*